(12) United States Patent
Holland

(10) Patent No.: US 7,508,664 B2
(45) Date of Patent: Mar. 24, 2009

(54) MECHANICAL ASSEMBLY TO SUPPORT ORTHOGONAL AIRFLOW DEVICES IN A NORMAL AIRFLOW SLOT OF A SERVER CHASSIS

(75) Inventor: William Gavin Holland, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 271 days.

(21) Appl. No.: 11/460,794

(22) Filed: Jul. 28, 2006

(65) Prior Publication Data

US 2008/0024982 A1     Jan. 31, 2008

(51) Int. Cl.
*H05K 7/20* (2006.01)

(52) U.S. Cl. .................. 361/695; 361/687; 361/690; 361/694; 165/104.33; 454/184

(58) Field of Classification Search .......... 361/687, 361/690, 694–695; 454/184; 62/259.2; 312/223.2; 165/80.3, 121
See application file for complete search history.

(56) References Cited

U.S. PATENT DOCUMENTS

| | | | | |
|---|---|---|---|---|
| 4,103,737 | A * | 8/1978 | Perkins | 165/109.1 |
| 4,699,208 | A * | 10/1987 | Wolf et al. | 165/47 |
| 4,765,397 | A * | 8/1988 | Chrysler et al. | 165/104.33 |
| 5,019,880 | A | 5/1991 | Higgins | |
| 5,077,601 | A * | 12/1991 | Hatada et al. | 257/722 |
| 5,120,004 | A | 6/1992 | Matthias | |
| 5,297,005 | A * | 3/1994 | Gourdine | 361/697 |
| 5,613,552 | A * | 3/1997 | Osakabe et al. | 165/104.21 |
| 5,810,072 | A * | 9/1998 | Rees et al. | 165/80.3 |
| 6,400,567 | B1 * | 6/2002 | McKeen et al. | 361/695 |
| 6,450,251 | B1 | 9/2002 | Lin et al. | |
| 6,771,499 | B2 | 8/2004 | Crippen et al. | |
| 6,867,967 | B2 * | 3/2005 | Mok | 361/687 |
| 6,912,129 | B2 * | 6/2005 | Baker et al. | 361/695 |
| 6,925,829 | B2 * | 8/2005 | Wei | 62/259.2 |
| 6,935,419 | B2 * | 8/2005 | Malone et al. | 165/185 |
| 7,085,133 | B2 * | 8/2006 | Hall | 361/695 |
| 7,248,472 | B2 * | 7/2007 | Vinson et al. | 361/694 |

(Continued)

FOREIGN PATENT DOCUMENTS

GB     2174193     10/1986

(Continued)

*Primary Examiner*—Jayprakash N Gandhi
*Assistant Examiner*—Courtney L Smith
(74) *Attorney, Agent, or Firm*—Cynthia Byrd; Jeffrey L. Streets; Streets & Steele

(57) ABSTRACT

An assembly that facilitates the use of modules requiring orthogonal airflow in a chassis providing normal airflow. Partitions within the housing direct ambient airflow from the front air inlet, through the modules, and out the rear air exhaust. The housing and partitions define first and second vertically and horizontally offset slots for receiving first and second orthogonal airflow modules, and also define separate first and second airflow pathways. The first airflow pathway provides airflow through a front air inlet, under the second module, orthogonally through the first module and out the rear air exhaust. Similarly, the second airflow pathway provides airflow through a front air inlet, over the first module, orthogonally through the second module and out the rear air exhaust. Both airflow pathways both draw ambient air into the housing and exhaust warm air from the rear of the housing, while keeping the two airflow pathways separated.

10 Claims, 4 Drawing Sheets

U.S. PATENT DOCUMENTS

| | | |
|---|---|---|
| 7,259,961 B2 * 8/2007 | Lucero et al. | 361/695 |
| 7,259,963 B2 * 8/2007 | Germagian et al. | 361/695 |
| 7,310,228 B2 * 12/2007 | Chen | 361/695 |
| 2005/0259392 A1 * 11/2005 | Vinson et al. | 361/687 |
| 2005/0259393 A1 * 11/2005 | Vinson et al. | 361/690 |
| 2005/0281016 A1 * 12/2005 | Wang et al. | 361/810 |
| 2007/0133168 A1 * 6/2007 | Shabany | 361/695 |

FOREIGN PATENT DOCUMENTS

| | | |
|---|---|---|
| JP | 2003021387 A | 1/2003 |
| SE | 9500659 A | 8/1996 |

* cited by examiner

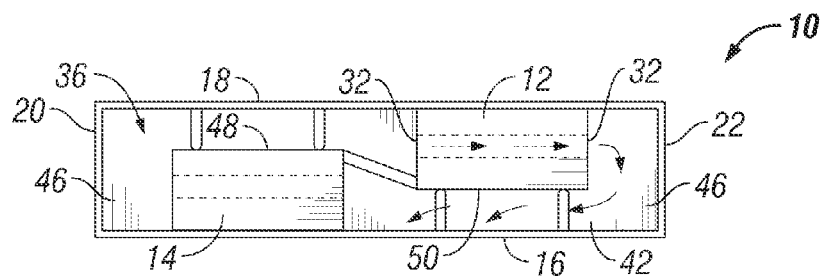
FIG. 1C
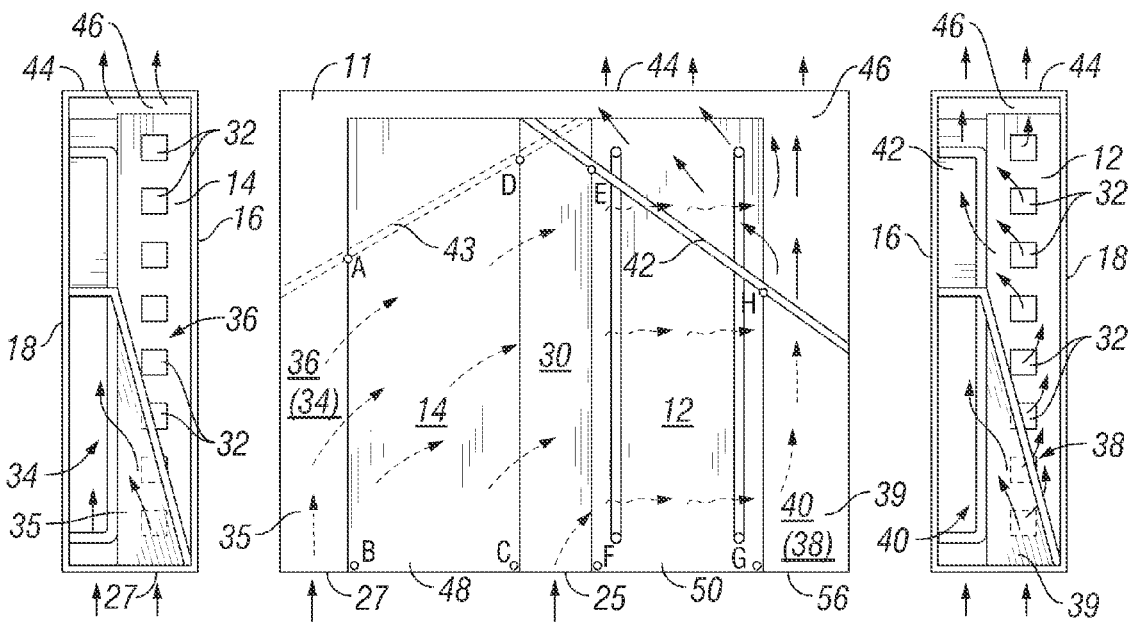
FIG. 1D  FIG. 1B  FIG. 1E
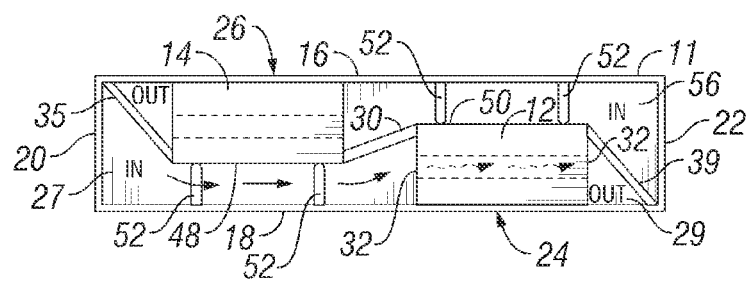
FIG. 1A

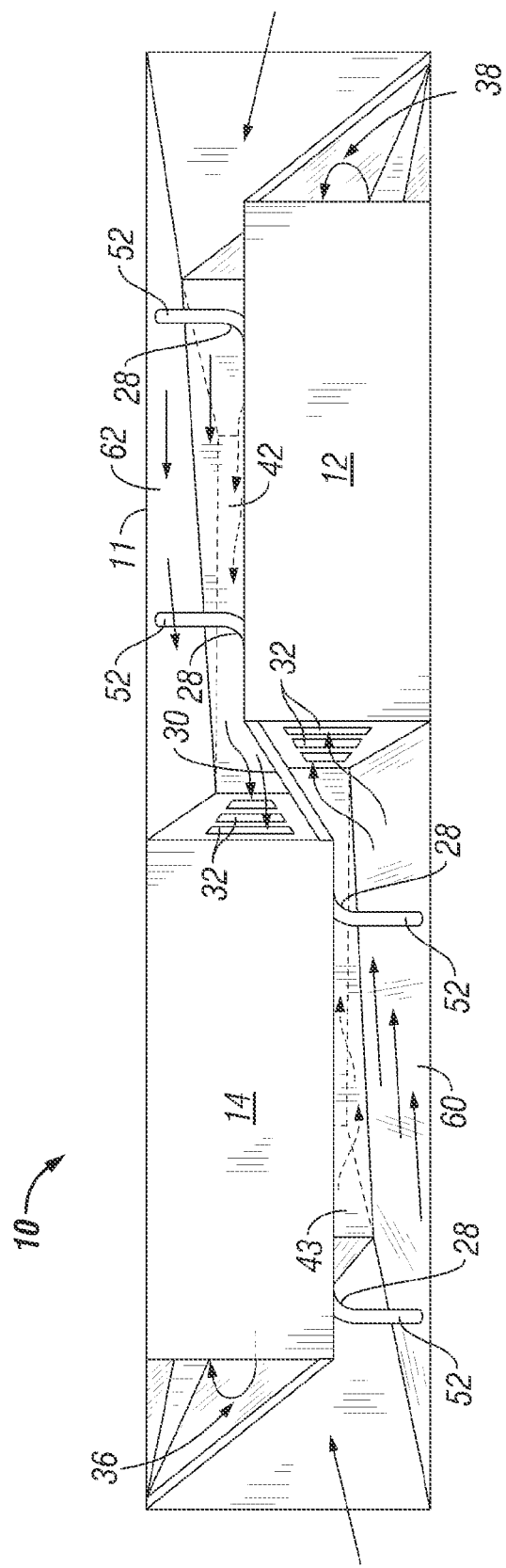
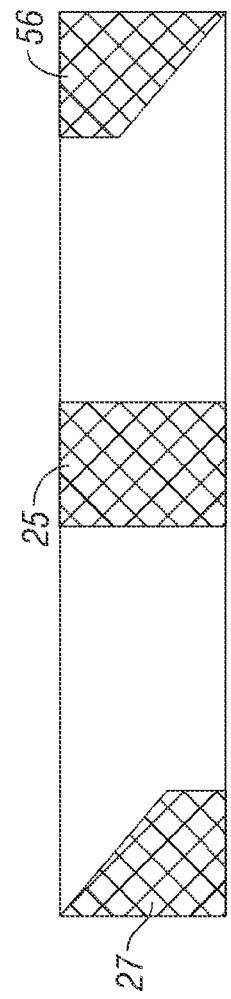

MECHANICAL ASSEMBLY TO SUPPORT ORTHOGONAL AIRFLOW DEVICES IN A NORMAL AIRFLOW SLOT OF A SERVER CHASSIS

BACKGROUND OF THE INVENTION

1. Field of the Invention

The present invention relates to systems and methods for directing air flow through an electronics cabinet.

2. Description of the Related Art

Computer systems, along with other components that support their use and maintenance, generate large amounts of heat. This heat must be continually removed to prevent the components from reaching elevated temperatures that can cause damage or failure of the components. While heat sinks may be utilized to conduct heat away from a point source of heat and distribute that heat over a large surface area, it is air convection that is ultimately responsible for removing heat energy from the cabinet. In nearly all significant computer installations, the amount of heat that must be removed requires the use of forced convection through or around the heat producing component. The cabinets, chassis and individual components are designed and configured to accommodate the forced flow of air through channels in or between the components and remove sufficient heat to prevent damage to the components. Often, the air flow impedance of each device must be strictly controlled in order to maintain the proper internal distribution of airflow.

However, there are also limitations in how these components can be designed. For example, the components require electrical connections, computer cabling, visual indicators, maintenance accessibility, and structural integrity, as well as channels for air flow. Therefore, decisions about the amount and direction of air flow have to be made during the component design process in order to accommodate all of the foregoing objectives. Computer installations must then follow the fixed operational requirements that are dictated by the component design.

Furthermore, a modular chassis, such as a blade server, contains slots for the installation of subsystem devices or components. Each installable device is designed according to a specific chassis slot architecture which defines the power, cooling and mechanical support that the slot provides for the device, the electrical or optical signals between the chassis slot and the device, and, in the case of an input/output device, the external surface of the device so that input/output connectors, indicators, and controls will be accessible to the user of the chassis. In general, a device must be uniquely redesigned for each chassis slot into which it might be installed.

Among these design considerations, there are two main airflow orientations used within devices that are designed for use in a modular chassis. Orthogonal airflow, which includes side-to-side, top-to-bottom, and bottom-to-top airflow, allows the external surface of the device to be consumed with input/output connectors, indicators and displays, or input controls, without any need to provide surface area for airflow. Normal airflow, which includes front-to-back and back-to-front airflow, requires that the external surface of the device contain any input/output connects, outputs or inputs, along with the necessary air openings to provide the required air entry or exit.

Airflow orientation is a major constraining element in the design of these chassis and the devices that are installed into them. The airflow orientation in the chassis is chosen and designed to best accommodate the types of devices which will be installed in the architected slots. Devices are not interchangeable or inoperable between slots with different airflow orientations. A device designed specifically for airflow to enter or exit the chassis through its external surface, such as a normal airflow device using a perforated faceplate or bulkhead for air entry or exit, must be redesigned to operate in a slot having both air entry and exit provided through the chassis with no external airflow required or allowed, such as an orthogonal airflow device. In an orthogonal airflow device, the air enters at one or more locations around the device from within the chassis and exits from one or more distinct locations around the device back into the chassis. An orthogonal airflow device has a solid bulkhead and faceplate and provides no openings for airflow into or out of the chassis. Generally, an orthogonal airflow device can provide significantly more input/output density than a similarly sized normal airflow device, since no external surface space is reserved for airflow. However, normal airflow can be beneficial for an input/output device having external interface components that require airflow for cooling, such as input/output connectors that contain optical transceivers.

While some devices can be operated with airflow in either direction along a specific orientation, these devices are still not operable with airflow that is oriented at a right angle to the specified airflow. For example, an orthogonal airflow device can not be used in a chassis that provides only normal airflow. Some other devices are architected to operate in either of two positions as long as the airflow direction is reversed exactly 180 degrees. For example, certain components are compatible with either top-to-bottom or bottom-to-top airflow, based on which slot it is installed in. However, even these modules cannot operate in a slot where the airflow is from front-to-back.

Therefore, there is a need for an apparatus that would allow for the use of existing devices or components designed for one chassis slot architecture in different and incompatible chassis slot architecture. It would be desirable if this apparatus would allow a devices requiring orthogonal airflow to be used in a chassis providing normal airflow. It would be beneficial for the apparatus to be compact, yet provide sufficient airflow for cooling to prevent damage to the orthogonal airflow components.

SUMMARY OF THE INVENTION

The present invention provides an apparatus for facilitating the use of modules requiring orthogonal airflow in a chassis providing normal airflow. A preferred embodiment of the apparatus comprises a housing having a front face including an air inlet, a rear face having an air exhaust, and a plurality of partitions within the housing, the housing and partitions defining first and second vertically and horizontally offset slots for receiving first and second orthogonal airflow modules, wherein the housing, partitions and first and second modules cooperatively define separate first and second airflow pathways, wherein the first airflow pathway provides airflow through a front air inlet into the housing, under the second module, orthogonally through the first module and out the rear air exhaust, wherein the second airflow pathway provides airflow through a front air inlet into the housing, over the first module, orthogonally through the second module and out the rear air exhaust.

In one embodiment, the front face of the housing has a first air inlet dedicated to the first airflow pathway and second air inlet dedicated to the second airflow pathway. Optionally, the front face of the housing may have a central air inlet providing air to both the first and second airflow pathways.

It is preferred that the plurality of partitions includes a central partition extending between the modules to isolate the first airflow pathway under the second module from the second airflow pathway over the first module. It is also preferred that the housing includes a first air handling section to the left of one of the modules and a second air handling section to the right of one of the modules, wherein the first and second air handling sections are each divided into an inlet plenum and an exhaust plenum. The cross-sectional area of the inlet plenum may decrease from front to back and the cross-sectional area of the exhaust plenum may increase from front to back. Optionally, the inlet plenum does not extend the full length of the module. In a further option, the exhaust plenum does extend the full length of the module.

The plurality of partitions may also include a first exhaust chamber partition separating the second airflow pathway over the first module from a first section of the exhaust chamber over the first module. Still further, the plurality of partitions may include a second exhaust chamber partition separating the first airflow pathway under the second module from a second section of the exhaust chamber under the second module.

BRIEF DESCRIPTION OF THE DRAWINGS

FIG. 1 is a schematic diagram of an assembly for housing two orthogonal airflow modules in a normal airflow chassis. The airflow associated with the module on the right side is highlighted.

FIG. 3 is a front perspective view of the assembly with the front face removed and two modules positioned within the housing.

FIG. 4 is a schematic diagram of a front panel having air inlets.

DETAILED DESCRIPTION

Figure 2C:
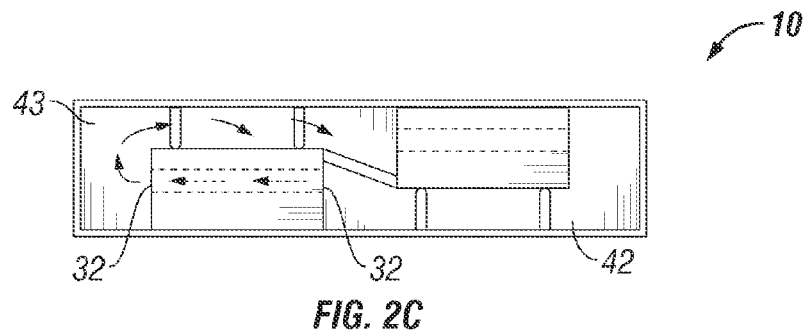
FIG. 2 is a schematic diagram of an assembly for housing two orthogonal airflow modules in a normal airflow chassis. The airflow associated with the module on the left side is highlighted.

The present invention provides an apparatus or assembly that facilitates the use of modules requiring orthogonal airflow in a chassis providing normal airflow. The apparatus comprises a housing having a front face with an air inlet for drawing ambient air into the assembly for cooling the modules that have electronic components that generate heat during use. The housing also comprises a rear face having an air exhaust opposite the air inlet end for exhausting warmed air from the housing and thereby removing heat from the modules.

A plurality of partitions is disposed within the housing to direct airflow from the front air inlet, through the modules, and out the rear air exhaust. The housing and the plurality of partitions define first and second vertically and horizontally offset slots for receiving first and second orthogonal airflow modules. Preferably, the assembly is received in a slot designed for a pair of normal airflow devices. Accordingly, the assembly provides the mechanical support and retention of the modules, mechanical retention of the assembly itself within the normal airflow slots, and electrical connection between the modules and the chassis connections intended for normal airflow modules.

In accordance with the assembly of the present invention, the housing, the partitions and the first and second modules cooperatively define separate first and second airflow pathways. The first airflow pathway provides airflow through a front air inlet into the housing, under the second module, orthogonally through the first module and out the rear air exhaust. Similarly, the second airflow pathway provides airflow through a front air inlet into the housing, over the first module, orthogonally through the second module and out the rear air exhaust. The two airflow pathways both draw ambient air from the front face of the housing and exhaust warm air from the rear face of the housing, even allowing the warm air to mix somewhat in an exhaust chamber prior to exiting the housing, but the two airflow pathways are generally separate from each other.

To maintain two separate airflow pathways from front to back, the airflow pathways may be described as somewhat of a double helical pattern. The pathways form a double helix in the sense that a first airflow pathway progresses rearward while simultaneously beginning at the left, going along the bottom to the right, up the right side, then over a module to the left, while a second airflow pathway progresses rearward while simultaneously beginning at the right, going along the top to the left, down the left side, then under a module to the right. The foregoing description is intended to aid in a full understanding of the invention and is not intended in any limiting sense.

In a preferred embodiment, the front face of the housing has a first air inlet dedicated to the first airflow pathway and a second air inlet dedicated to the second airflow pathway. Most preferably, the first and second air inlets are disposed at opposing sides of the front face. Optionally, the front face of the housing may also have a central air inlet providing air to both the first and second airflow pathways.

The plurality of partitions within the housing preferably includes a central partition that extends between the modules to isolate the first airflow pathway under the second module from the second airflow pathway over the first module. Opposing left and right edges of the front-to-back running central partition contacts, and preferably seals against, the two offset modules. The central partition tilts so that one edge contacts a lower edge of the upper module and the opposing edge contacts an upper edge of the lower module. The central partition runs substantially the full length of the module, but may be somewhat shorter so long as the airflow pathways remain isolated.

The housing includes a first air handling section to the left of the modules and a second air handling section to the right of the modules, wherein the first and second air handling sections are each divided into an inlet plenum and an exhaust plenum. The inlet and exhaust plenums (or chambers) are divided by a plenum partition that extends from the housing wall into contact with, and preferably sealing against, the adjacent module. The inner edge of the plenum partition contacts the adjacent module at a fairly constant elevation that is above the module airflow ports of the lower module and below the module airflow ports of the upper module. The outer edge of the plenum partition is preferable permanently attached to the housing wall. However, the outer edge of the plenum partition most preferably changes elevation along the length of the plenum partition to define inlet and exhaust plenums with changing cross-sectional area. Most preferably, the cross-sectional area of the inlet plenums decreases from front to back and the cross-sectional area of the exhaust plenums increases from front to back.

The advantage of this plenum configuration may be understood more clearly by thinking of the inlet and exhaust plenums as manifolds, where the inlet plenum serves as an inlet manifold and distributes inlet air to a plurality of longitudinally disposed module airflow ports and the exhaust plenum serves as an exhaust manifold collecting exhaust air from a plurality of longitudinally disposed module airflow ports. Accordingly, the airflow in inlet plenum is greater at the front and diminishes steadily toward the back, whereas the airflow in the exhaust plenum is lower at the front and increases steadily toward the back The plenum partition described herein makes efficient use of the air handling section for both purposes.

It should be recognized that it is not required for the inlet plenum to extend the full length of the module. Rather, it is preferable for the inlet plenum to extend sufficiently far, perhaps ½ to ¾ the length of the module, to receive the normal airflow from the air inlet air and to distribute that air to an adjacent upper or lower airway. The inlet plenum may be terminated by an exhaust chamber partition, which is preferably unitary with the plenum partition. Terminating the inlet plenum in this manner allows the exhaust plenum to use the full cross-sectional area of the air handling section in the region rearward of the exhaust chamber partition. By contrast, the exhaust plenum (or chamber) must extend from the rear at least as far forward as the forward-most airflow port of the module. Most preferably, the exhaust plenum will run the full length of the housing, although it will have a much smaller cross-sectional area at the front. Optionally, the outer edge of the plenum partition may attach to the housing side wall, bottom wall and/or top wall as needed to achieve a desired cross-sectional area. Most preferably, the cross-sectional area is changed gradually in a manner proportional to the distribution and collection of air to and from the module.

The upper and lower airways extend from an inlet plenum over or under a module, past the central partition, and into the airflow ports of the opposing module. Accordingly, the upper and lower airways allow the airflow to transition from the normal airflow to the inlet to the orthogonal airflow required by the modules. The housing preferably includes an exhaust chamber partition defining the rearward limit of each airway. The exhaust chamber partition extends from the housing to the module and runs from the inlet plenum to the opposing module. The exhaust chamber partition most preferably runs at an angle relative to the housing from the point where the inlet plenum terminates to a point on the opposing module just rearward of the last airflow port. Accordingly, the upper and lower airways both gradually widen as air approaches the airflow ports of the modules and provides substantially equal airflow to all of the airflow ports along the length of the modules.

After passing through the modules, warmed air exits airflow ports on the opposing side of the module and is collected in the exhaust plenum, as previously described. The exhaust plenum directs the warmed air rearward. As the exhaust air moves rearward, the inlet plenum terminates and the exhaust plenum utilizes the full cross-sectional area of the air handling section. Most preferably, the exhaust air is allowed to expand outward along the full rear face of the housing, thereby reducing pressure drop through the housing. The region of the exhaust plenum that utilizes the full cross-sectional area of the handling section has access an exhaust chamber that includes the space behind the exhaust chamber partition, previously describes and also space behind the modules themselves.

In a preferred embodiment, the modules themselves have a housing that cooperates with the partitions and the assembly housing to fully define the airflow pathways as described. In this embodiment, the absence of a module prevents the proper airflow. Therefore, if a module is not removed, it is necessary to insert another module or a "filler panel" in order to continue the proper air flow patterns. In an alternative embodiment, the housing could include full upper and lower airway partitions. These full upper and lower airway partitions may be thought of as extensions of the central partition that run along the upper surface of the lower module and along the lower surface of the upper module. Furthermore, the upper and lower airway partitions may extend to, and preferably be integrally formed with, the inner edge of the plenum partitions. In this manner, no filler panels are ever needed and there are fewer contact points or edges between the partitions and the modules to worry about. Furthermore, this later embodiment would allow the use of orthogonal flow modules having different widths.

FIGS. 1A-E are schematic diagrams of an assembly 10 for housing two orthogonal airflow modules 12, 14 in a normal airflow chassis (not shown). FIGS. 1A-E illustrate the assembly from the front (FIG. 1A), the top (FIG. 1B), the back (FIG. 1C), the left side (FIG. 1D), and the right side (FIG. 1E). FIGS. 1A and 1C-E are shown as they would be seen from their respective sides of the assembly 10, if the side panel facing the particular view was removed. In an actual assembly 10, the preferred front panel has defined inlet regions, the preferred back panel has a porous screen or mesh, and the top, bottom, left side and right side are solid panels.

FIG. 1A illustrates the front of the assembly 10, including the housing 11 made with solid panels for the top 16, bottom 18, left side 20, and right side 22, shown as if the front panel were removed. A first slot 24 and a second slot 26 are defined by partitions and stands for receiving a first orthogonal airflow module 12 and a second orthogonal airflow module 14. Ambient air flows into the housing on the left side of the front (as shown in FIG. 1A) through a left inlet plenum 27 where it says "IN", then flows under the second module 14 supported on rails 28, under a central partition 30, and through the first module 12 (entering and exiting the module 12 through a plurality of airway ports 32 spaced longitudinally along the opposing sides of the module) before entering the right exhaust plenum 29. The arrows within FIG. 1A represent air flow that, along with the air flow shown in FIGS. 1B-E, collectively illustrate a first airflow pathway for cooling the first module 12. A second airflow pathway is illustrated using the same views of the assembly 10 in FIGS. 2A-E. Airflow that would be seen is shown with an arrow having a full tail, airflow that is below a component or panel is shown with an arrow having a dashed tail, and the airflow through the modules is shown with a wavy dashed tail.

FIG. 1B is a top view of the assembly 10, shown as if the top panel 16 of the housing 11 were removed. Accordingly, air flows into the housing 11 through the left air inlet 27 and to a lesser extent through the central air inlet 25, rearward through the left inlet plenum 34 (disposed directly below the left exhaust plenum 36, as shown more clearly in the left side view of FIG. 1D), under the second module 14, under the central partition 30, through the first module 12 via the airflow ports 32, rearward along the right exhaust plenum 38 (disposed directly below the right inlet plenum 40, as shown more clearly in the right side view of FIG. 1E), expanding or spreading up, over and around the back end of the first module 12 behind the exhaust chamber partition 42, and out the rear face 44 of the housing 11. The rear face 44 is formed of a mesh or screen to allow air to escape with minimal resistance or pressure drop. The region between the rear face 44 and the exhaust chamber partition 42 may be referred to as an exhaust chamber 46. The flow of warmed air into, through, and out of the exhaust chamber 46 is best understood by reference to each of FIGS. 1B-E.

Referring to FIGS. 1D-E, these left and right side views emphasis the general construction of the left plenum partition 35 and the right plenum partition 39. These plenum partitions 35, 39 each serve to maintain isolation of the ambient inlet air being distributed to the airways and the warmed exhaust air being collected from the modules. The plenum partitions 35, 39 are angled or curved in the rearward longitudinal direction of the housing 11 in order to decrease the size (cross-sectional area) of the inlet plenums and increase the size (cross-sectional area) of the exhaust plenums.

In reference again to FIG. 1B, another embodiment of the invention can be envisioned in which two additional partitions are included. A left module partition 48, defined by points A, B, C and D, and a right module partition 50, defined by points E, F, G and H. Optionally, the module partitions may extend further rearward, as an actual module. Still, the module partitions are integrated with the other partitions to maintain the airflow pathways even in the absence of a module. For example, the left module partition 48 is secured between the right edge of the left plenum partition 35 and the left edge of the central partition 30. Similarly, the right module partition 50 is secured between the left edge of the right plenum partition 39 and the right edge of the central partition 30. The module partitions 48, 50 are preferably also secured to the exhaust chamber partitions. The module partitions and/or the modules themselves may be supported by stands 52, which may include rails 28 (shown in FIG. 3) which preferably run substantially the length of the module (or perhaps to the exhaust chamber partition) for slidably receiving and supporting the module.

FIGS. 2A-E are schematic diagrams of an assembly for housing two orthogonal airflow modules in a normal airflow chassis. FIGS. 2A-E are identical to FIGS. 1A-E, except for the arrows that trace out a second airflow pathway for cooling the second module. Accordingly, many of the reference numbers have been left off, but components may be identified by reference to FIGS. 1A-E.

Figures 2B, 2D, 2E:
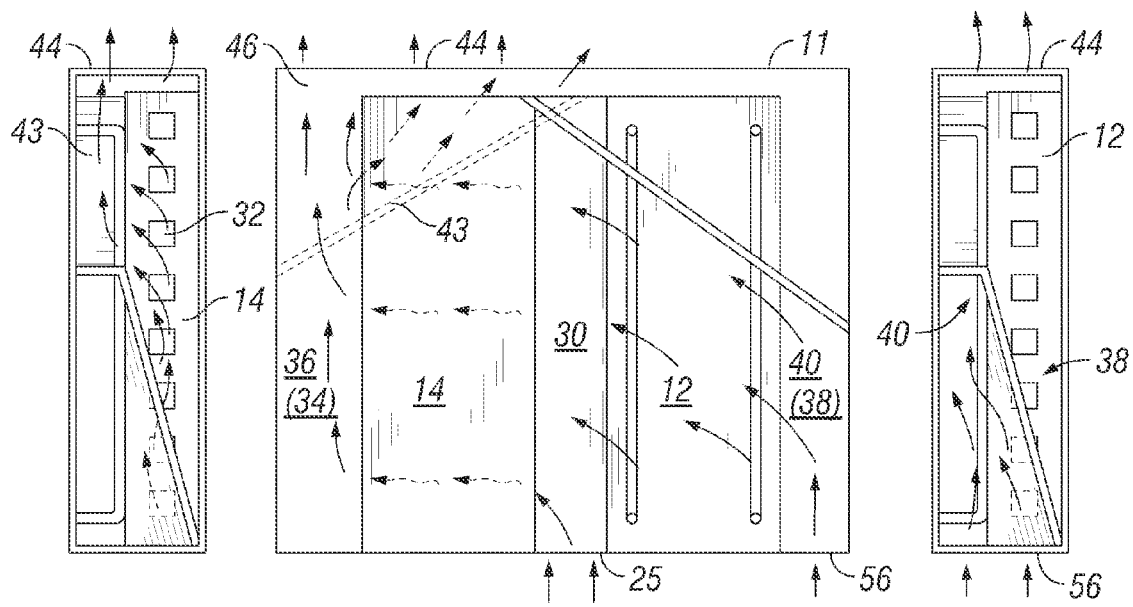
Figure 2A:
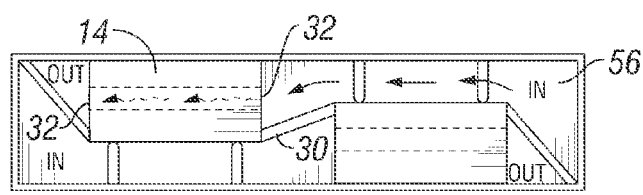

FIG. 2B is a top view of the assembly 10, shown as if the top panel 16 of the housing 11 were removed. The second airflow pathway shown in this Figure is responsible for cooling the second orthogonal airflow module 14. Accordingly, air flows into the housing 11 through the right air inlet 56 and to a lesser extent through the central air inlet 25, rearward through the right inlet plenum 40 (disposed directly above the right exhaust plenum 38, as previously discussed), over the first module 12, over the central partition 30, through the second module 14 via the airflow ports 32, rearward along the left exhaust plenum 36 (disposed directly above the left inlet plenum 34, as previously discussed), expanding or spreading down, under, and around the back end of the second module 14 behind the exhaust chamber partition 43, and out the rear face 44 of the housing 11. The region between the rear face 44 and the exhaust chamber partition 43 forms of part of the exhaust chamber 46, which preferably extends across the entire rear face 44. The flow of warmed air into, through, and out of the exhaust chamber 46 is best understood by reference to each of FIGS. 2B-E.

FIG. 3 is a front perspective view of the assembly 10 with the front panel removed and the two modules 12, 14 positioned within the housing 11. In this view, it is easier to see that the stands 52 and rails 28 do not block the airflow through the lower airway 60 or upper airway 62. Also, it is possible to see that the left and right air inlet partitions 35, 39 angle downward and upward, respectively, to gradually narrow and eventually close off the left and right inlet plenums 34, 40, respectively. As shown, the exhaust chamber partitions 42, 43 define the rearward limit of the airways 60, 62, respectively.

FIG. 4 is a schematic diagram of a front panel 70 having a left air inlet 27, a central air inlet 25, and a right air inlet 56. This particular front panel 70 is designed to fit across the entire front of the housing 11. Accordingly, the screen or mesh type material that comprises the inlets 27, 25, 56 is limited in size to encourage the desired airflow patterns described above. Furthermore, this panel 70 is solid, in the region that will cover the front of the left and right exhaust plenums 36, 38 so that ambient air does not bypass the desired airflow pathways. Alternatively, and perhaps preferably, the exhaust plenums will include an independent partition across this triangular region, rather than rely upon an accurate fit of the front panel 70 to the front of the housing 11. The optional central air inlet 25 supplies ambient air to both modules 12, 14.

Figure 5:
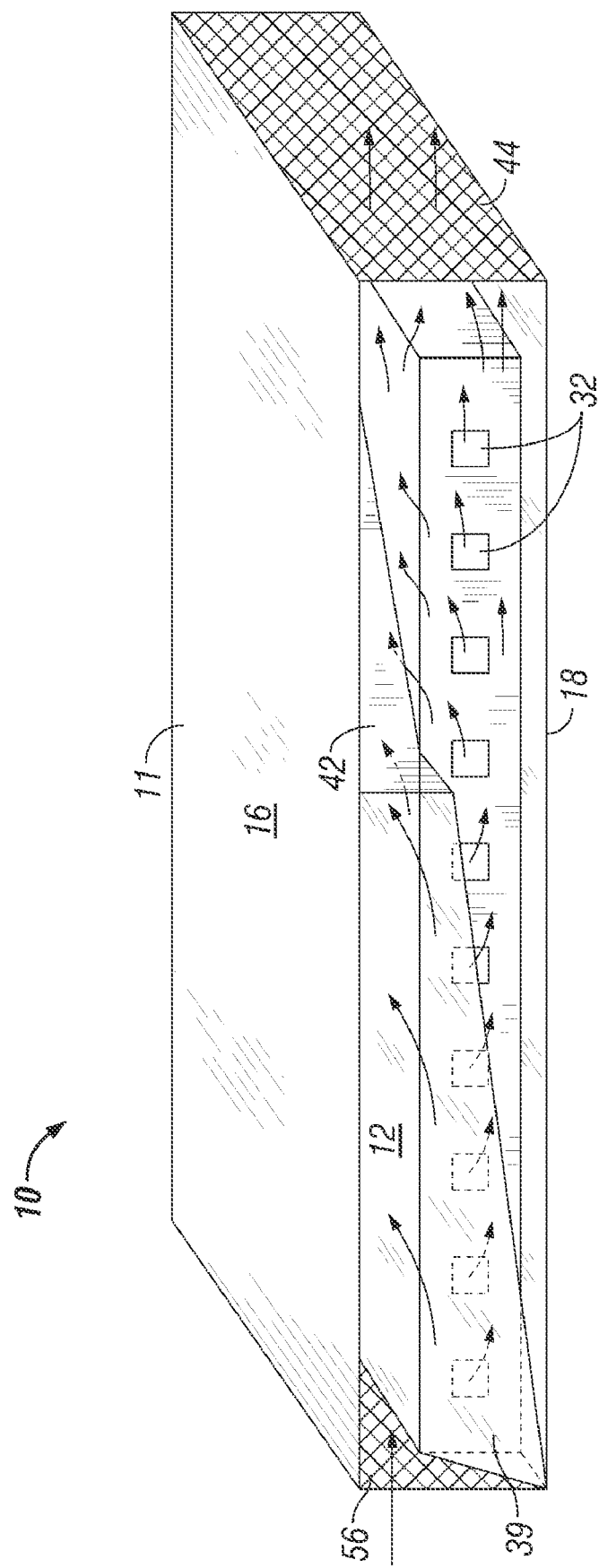
FIG. 5 is a side perspective view of the assembly with a side wall removed.

FIG. 5 is a side perspective view of the assembly 10 with the housing 11 shown as if the right side wall was removed. As part of the second airflow pathway, the ambient air inlet 56 communicates with the right inlet air plenum over the right plenum partition 29 and over the module 12 in front of the exhaust chamber partition 42 to the module 14 (not shown). As part of the first airflow pathway, the warmed air is collected from the airflow ports 32 of the module 12 into the right exhaust plenum beneath the right plenum partition 39 and rearward to the exhaust chamber rearward of the exhaust chamber partition 42 and behind the module 12. The warmed air is eventually released from the exhaust chamber through the rear screen panel 44.

As described herein, the slots and the modules received within the slots are considered to be "vertically and horizontally offset." The term "vertically and horizontally offset" means that the slots or modules are not vertically aligned (one module directly above the other) and not horizontally aligned (one module directly across from the other), although some portion or no portion of the adjacent modules may above or across from the other.

The terms "comprising," "including," and "having," as used in the claims and specification herein, shall be considered as indicating an open group that may include other elements not specified. The term "consisting essentially of," as used in the claims and specification herein, shall be considered as indicating a partially open group that may include other elements not specified, so long as those other elements do not materially alter the basic and novel characteristics of the claimed invention. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

The invention claimed is:

1. An apparatus for facilitating the use of electronic modules requiring orthogonal airflow in a chassis providing normal airflow, the apparatus comprising:

a housing having a front face including at least one an air inlet, a rear face having air exhaust, and a plurality of partitions within the housing, the housing and partitions defining first and second vertically and horizontally offset slots for receiving first and second electronic modules;

wherein the housing, the plurality of partitions and the first and second modules cooperatively define separate first and second airflow pathways, wherein the first airflow pathway provides airflow through the front face into the housing, under the second module, orthogonally through the first module and out the rear air exhaust, and wherein the second airflow pathway provides airflow through the front face into the housing, over the first module, orthogonally through the second module and out the rear air exhaust.

2. The apparatus of claim 1, wherein the front face of the housing includes a first air inlet dedicated to the first airflow pathway and second air inlet dedicated to the second airflow pathway.

3. The apparatus of claim 2, wherein the front face of the housing further includes a central air inlet providing air to both the first and second airflow pathways.

4. The apparatus of claim 1, wherein the plurality of partitions includes a central partition extending between the modules to isolate the first airflow pathway under the second module from the second airflow pathway over the first module.

5. The apparatus of claim 1, wherein the housing includes a first air handling section to the left of one of the modules and a second air handling section to the right of one of the modules, wherein the first and second air handling sections are each divided into an inlet plenum and an exhaust plenum.

6. The apparatus of claim 5, wherein the cross-sectional area of the inlet plenum decreases from front to back and the cross-sectional area of the exhaust plenum increases from front to back.

7. The apparatus of claim 6, wherein the inlet plenum does not extend the length of the module.

8. The apparatus of claim 7, wherein the exhaust plenum does extend the length of the module.

9. The apparatus of claim 1, wherein the plurality of partitions includes a first exhaust chamber partition separating the second airflow pathway over the first module from a first section of the exhaust chamber over the first module.

10. The apparatus of claim 9, wherein the plurality of partitions includes a second exhaust chamber partition separating the first airflow pathway under the second module from a second section of the exhaust chamber under the second module.

* * * * *